United States Patent [19]
Ishibashi et al.

[11] Patent Number: 5,087,829
[45] Date of Patent: Feb. 11, 1992

[54] HIGH SPEED CLOCK DISTRIBUTION SYSTEM

[75] Inventors: Kenichi Ishibashi, Kokubunji; Takehisa Hayashi, Kodaira; Toshio Doi, Kokubunji; Mitsuo Asai, Kokubunji; Noboru Masuda, Kokubunji; Akira Yamagiwa; Toshihiro Okabe, both of Hadano, all of Japan

[73] Assignee: Hitachi, Ltd., Tokyo, Japan

[21] Appl. No.: 443,503

[22] Filed: Dec. 1, 1989

[30] Foreign Application Priority Data

Dec. 7, 1988 [JP] Japan .................. 63-307897

[51] Int. Cl.$^5$ .................. H03K 5/13; H03K 5/00
[52] U.S. Cl. .................. 307/269; 307/262; 328/155; 328/62; 328/63; 328/105; 328/55
[58] Field of Search .................. 307/289, 480; 328/155, 328/62, 67, 60, 104, 105, 55; 375/120

[56] References Cited

U.S. PATENT DOCUMENTS 4,789,996 12/1988 Butcher .................. 375/120
4,847,870 7/1989 Butcher .................. 375/120

OTHER PUBLICATIONS

Anceau, "A Synch. Approach for Clocking VLSI Systems", IEEE Journal of S.S.C., vol. SC-17), Feb. 82, pp. 51-56.
Blum, "Automatic Adjustment of Several Decentrally Generated Clock . . . ", IBM Tech. Dis. Bulletin, vol. 24, No. 2, 7/81.
Koetzle, "Computer Clock Distribution System w/Prog. Delay & Auto Adjust." IBM TBB, vol. 18, No. 6, 11/75.

Primary Examiner—Timothy P. Callahan
Attorney, Agent, or Firm—Antonelli, Terry, Stout & Kraus

[57] ABSTRACT

This invention discloses a clock distribution system which distributes a first clock signal as a reference clock as the reference for the phase and frequency to each processing unit (e.g. LSI) and generates a multi-phase second clock signal to be used in each processing unit by a delay circuit group whose delay time is adjusted. The clock distribution system comprises a clock generation block for generating a one-phase reference clock; a first control loop for comparing the phase of the reference clock with the phase of a feedback signal and adjusting the phase of the reference clock so that their phases are in agreement; and a second control loop including a delay circuit group consisting of a plurality of variable delay circuits to which the reference clock phase-adjusted by the first control loop is inputted and which are connected in series, and means for generating a multi-phase clock signal by use of the output signal of each of the plurality of variable delay circuits and the phase-adjusted referencde clock, controlling the delay time of the plurality of variable delay circuits so as to accomplish a predetermined relation with the period of the phase-adjusted reference clock and applying one of the multi-phase clock signals as the feedback signal described above to the first control loop.

21 Claims, 15 Drawing Sheets

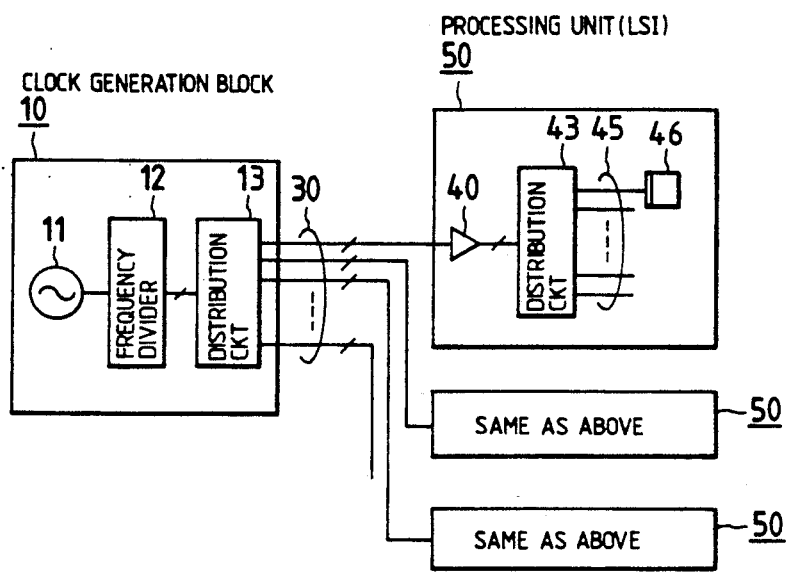
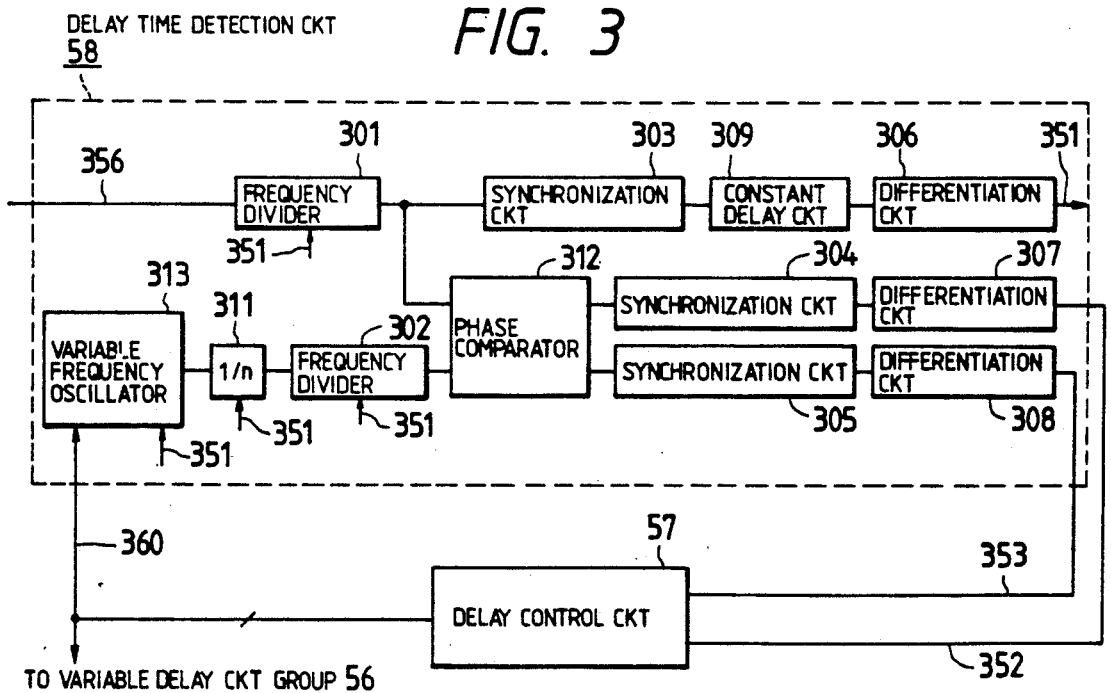

VARIABLE DELAY CKT 51 OR 60

DECODER 1114

PHASE COMPARATOR 53

3 BITS COUNTER 1512 OR 1513

HIGH SPEED CLOCK DISTRIBUTION SYSTEM

BACKGROUND OF THE INVENTION

This invention relates to a clock distribution system of a computer or the like, and more particularly to a clock distribution system which will is suitable for use in a clock distribution system of a computer for processing operations at a high speed.

An example of a clock distribution system of a conventional computer is shown in FIG. 2. In FIG. 2, reference numeral 10 represents a clock generation block, 50 is a processing unit (which will be hereby assumed as LSI) which is the destination of distribution of the clock generation block, and 30 identifies signal paths connecting the clock generation block 10 to the processing unit 50 (such as wirings on a substrate or cables). Terminal distribution destinations (e.g. flip-flop 46) exist inside the processing unit 50. This clock distribution system divides the frequency of high frequency signals generated by a generator 11 into the necessary frequency and corresponding clock signals by a frequency divider 12, distributes the clock signals to each processing unit through a distribution circuit 13 and the signal paths 30, and distributes them further to the flip-flop 46 through an input buffer 40, a distribution circuit 43 and wirings 45 inside each processing unit. The conventional clock distribution system involves the following two problems.

First of all, if the signal propagation delay of the distribution circuit 13, the signal paths 30, the input buffer 40, the distribution circuit 45 and the wiring 45 is different between the processing units 50, clock skew (phase variance of clock signals) in the flip-flop 46 occurs. If this clock skew is great, a problem exists regarding a high speed operation of the computer because each processing unit 50 operates in synchronism with the clock signals.

Secondly, if the frequency of the clock signal distributed to each processing unit 50 is high or the pulse width is small, influences of reflection occurring when it passes through the wirings on the substrate or the cables and damping of amplitude become great. It is therefore difficult to distribute those clock signals which have a high frequency and a small pulse width.

To cope with the first problem, an attempt has been made to reduce clock skew by adjusting the phases of clock signals. As a phase adjustment method of clock signals in a conventional computer, a method is known which disposes a delay at an intermediate part of each signal path 30 shown in FIG. 2, the waveform of the clock signal at each destination is observed by use of an oscilloscope and manually the delay is adjusted so as to match the phase with a set value. Japanese Patent Laid-Open No. 39650/1986 discloses a method which eliminates the necessity of adjusting the delays by changing the delay time of the delay by use of control signals. As a method which does not use the oscilloscope, Japanese Patent Laid-Open No. 39619/1986 discloses a method which constitutes a ring oscillator by clock distribution circuits, detects the signal delay time of the clock distribution circuit from its oscillation frequency and matches it with the stipulated value.

The second problem can be solved, in principle, by disposing a circuit which generates a high frequency signal in each processing unit and generating desired clock signals from the output of the circuit. For example, a clock signal having a relatively low frequency is inputted from outside, a high frequency signal is generated from this clock signal by a PLL circuit and a multiphase clock signal is generated by use of this high frequency signal. Japanese Patent Laid-Open No. 21919/1988 discloses a method which generates a clock signal synchronized with an external clock signal by use of a ring oscillator.

If the phase adjustment of the clock signals is made by use of the oscilloscope or the like to cope with the first problem, a great deal of time and labor is necessary for the adjustment and the adjustment is limited. Therefore, once the phase adjustment is made at a limited number of relay points, the clock signals must be sent to the terminal destination without adjustment. Variance of the signal propagation delay at these points, where the signals are sent without adjustment, limits reduction of clock skew. Particularly in the case of a LSI containing CMOS circuits in the clock distribution system, variance of the delay time due to processors or the like is great so that the clock signals inputted to the flip-flops inside LSI as the terminal destination have to great skew.

The method disclosed in Japanese Patent Laid-Open No. 39650/1986 eliminates the necessity of changing delays. But the clock signal phase must be observed to determine if the desired phase is present. Since the delay time is controlled by an analog voltage, this analog voltage produces the clock skew if it changes due to noise. In accordance with the method disclosed in Japanese Patent Laid-Open No. 39619/1986, the propagation times of the signal paths for feeding back the signal from each destination to the original input point must all be aligned. After all, therefore, the clock skew cannot be reduced unless the propagation time of a large number of signal paths is aligned.

The method which disposes the PLL circuit in each processing unit and generates a desired clock signal by frequency-dividing its output as the solution for the second problem is not free from the problem. Since PLL circuits in general use a high level control signals, they are susceptible to noise or the like when they co-exist with a LSI. Since a high frequency signal is always used inside the processing unit, problems in reliability such as the occurrence of noise develop.

Since the method disclosed in Japanese Patent Laid-Open No. 211919/1988 generates always the high frequency signal by a ring oscillator, the problem as with the PLL circuit occurs. Though the method using the PLL circuit or the ring oscillator can synchronize the low frequency external clock signal with the clock signal generated inside LSI, since the propagation delay of the distribution circuit which distributes the resulting clock signals varies from processing unit to processing unit, the clock skew at the flip-flop at the terminal destination remains unsolved.

In the co-pending patent application Ser. No. 152,916 filed Feb. 5, 1988 by some of the inventors of the present invention, there is disclosed a clock signal supply system comprising phase adjusting circuits for automatic adjustment of the phase shift of clock signals at a multiplicity of clock signal destinations. A first signal line transmits clock signals from a clock signal source to the phase adjusting circuits. A reference signal generation circuit generates a reference signal in predetermined relationship with the clock signals. A second signal line transmits the reference signal to the phase adjusting circuits. The clock signal received through the first signal line is compared with the reference signal received through the second signal line by the phase adjusting circuit, which then adjusts the phase of the received clock signal in predetermined phase relationship with the reference signal.

Co-pending patent application Ser. No. 395,958 filed Aug. 18, 1989 by some of the co-inventors of the present invention, discloses a clock signal supplying device provided with an automatic phase regulating function for preventing error in the phase regulation due to noise. In the device according to this application, a reference signal serves as a phase reference. Transmission lines for clock signals and a transmission line for the reference signal are coupled to the device, which is a clock signal supplying source, to devices, which are destinations of the distribution of the clock signals. The transmission line for the reference signal is adjusted in advance so as to produce no skew. For example, the frequency of the reference signal is set at a low value, for which the phase regulation is easy, and all of the transmission lines for the reference signal are made uniform in phase by keeping the load condition and the length of each of the lines uniform. In the device, which is the destination of distribution of the clock signal, a variable delay circuit regulates the phase of the clock signal and a phase comparing circuit compares the output of the variable delay circuit with the phase of the reference signal and outputs the result of the comparison. The amount of delay of the variable delay circuit is controlled to the output of the phase comparing circuit. A disturbance due to noise from the exterior or the interior during the phase regulation can produce errors in the amount of the phase regulation. In the device according to the above application, a noise filter is provided, which detects phase regulation errors to correct phase regulation. Furthermore, the phase regulation is produced while avoiding a period of time where noises is likely to be produced.

SUMMARY OF THE INVENTION

It is an object of the present invention to provide a clock distribution system and a computer which can reduce the number of lines of clock signals to be supplied to each processing unit and can generate multi-phase clock signals with reduced skew inside each processing unit.

In the present invention, a first clock signal which is a reference clock that is the phase and frequency reference is distributed to each processing unit (LSI) and a multi-phase second clock signal used in each processing unit is generated by a delay circuit group whose delay time is adjusted. The clock distribution system in accordance with the present invention comprises a clock generation block for generating a one-phase reference clock; a first control loop for comparing the phase of the reference clock with the phase of a feedback signal and adjusting the phase of the reference clock so that their phases are in agreement; and a second control loop including a delay circuit group of a plurality of series connected variable delay circuits, which input the reference clock phase-adjusted by the first control loop, and means for generating multi-phase clock signals by use of the output signal of each of the plurality of variable delay circuits and the reference clock, controlling the delay time of the plurality of variable delay circuits so as to attain a predetermined relation with the period of the phase-adjusted reference clock and applying one of the multi-phase clock signals as the feedback signal described above to the first control loop.

More specifically, the clock distribution system of the present invention includes a clock generation block for distributing the one-phase first clock signal (reference clock) to each processing unit (e.g. LSI), and each processing unit includes a phase adjustment block for aligning the phase of the first clock signal with the phase of a second clock signal (feedback signal), a delay circuit group of series connected a plurality of variable delay circuits which input the first clock signal phase-adjusted by the phase adjustment block, have an equal delay time means for generating multi-phase second clock signals by use of the output signals of the plurality of variable delay circuits and the phase-adjusted first clock signal and means for controlling the delay time of the variable delay circuits so that the delay time becomes a fraction of the period of the first clock signal.

The phase adjustment block is a means for aligning the phase of the first clock signal (reference clock) with the phase of the second clock signal (feedback signal) includes variable delay means for adjusting the phase of the first clock signal (reference clock), phase comparator means for comparing the phase of the first clock signal (reference clock) with that of the second clock signal (feedback signal) and delay control means for controlling the variable delay means by receiving the result of comparison of the phase comparator means. This relates to the phase adjustment block and is a means for aligning the phase of the second clock signal used in the processing unit with the phase of the first clock signal (reference clock) inputted to the processing unit, and constitutes a first control loop by using the first clock signal (reference clock) as the reference of phase.

The clock generation block for generating the multi-phase clock signals includes clock signal generation means for generating the multi-phase second clock signals by use of the output signal of each of the plurality of series connected variable delay circuits to which the phase-adjusted first clock signal (reference clock) is inputted by use of the phase-adjusted first clock signal (reference clock), a delay time detection circuit for measuring the delay time of the variable delay circuits and a delay control circuit for controlling the delay time of the variable delay circuits by receiving the result of measurement from the delay time detection circuit. This block generates the multi-phase clock signals by detecting and controlling the delay time of the variable delay circuits and constitutes a second control loop.

The delay time detection circuit for detecting the delay time of the variable delay circuits includes a variable frequency local oscillator formed by connecting the input terminals and output terminals of the variable delay circuits, and a phase comparator for comparing the frequency division signal of its output signal and the phase of the frequency division signal of the first clock signal. The control of the delay time of the variable delay circuits used for the variable frequency local oscillator is made by using digital signals.

The phase adjustment by the first control loop is stopped during the control of the delay time by the second control loop. After the control by the second control loop is complete, the control by the second control loop is stopped and at the same time, the phase adjustment by the first control loop is started. After the phase adjustment is complete, the phase adjustment by the first control loop is stopped.

In accordance with the present invention, since the one-phase first clock signal (reference clock) is supplied as the output from the clock generation block to the processing units as the destinations, the number of signal lines to be supplied can be reduced in comparison with the prior art example.

The means for aligning the phase of the second clock signal (feedback signal) with that of the first clock signal (reference clock) makes it possible to align a certain phase of the multi-phase clock signals at the terminal destination in each processing unit with the phase of the input of the first clock signal to the processing unit. In other words, it is possible not only to align the phase to the terminal destination inside the processing unit with the phase of the reference clock of the input of the processing unit but also to reduce the clock skew between the processing units. Accordingly, multiple phases can be aligned to desired phases by precisely aligning only a certain phase of the clock signal without generating the multi-phase signals. The number of necessary phase adjustments can be reduced in comparison with the prior art example which needs to align the phase of the destination for each phase.

The first clock signal (reference clock) does not have to be a particularly high frequency signal and a low frequency can be used. Therefore various problems with the prior art example using the high frequency signal, such as reflection and damping in the signal paths can be avoided.

The first control loop aligns one phase of the multi-phase clock signals used in the processing unit with the phase of the reference clock. Not only is clock skew reduced but also if only one phase is phase-adjusted, the other phases can be adjusted automatically. Accordingly, each of the phases of the multi-phase clock signals used in the processing unit can be aligned precisely and the adjustment for each phase becomes unnecessary.

When control is made conventionally by use of analog signals inside a LSI, the circuit is susceptible to the influences of noise. But since the present invention uses the digital signals for the control inside the digital circuit, any erroneous operation with high circuit resistance to noise is reduced.

Since the adjustment of the delay time by the first and second control loops is effected independently of each other, the clock skew can be reduced and adjusted easily.

BRIEF DESCRIPTION OF THE DRAWINGS

FIG. 2 is an overall structural view of prior art;

FIG. 3 is a block diagram showing an example of a delay time detection circuit used in the present invention;

DESCRIPTION OF THE PREFERRED EMBODIMENTS

A first embodiment of the present invention will be described with reference to FIG. 1. In FIG. 1, symbol (a) is a schematic view of a clock distribution circuit of the present invention and (b) is a detailed view showing in detail a processing unit (LSI) 50 in (a).

Figure 1A:
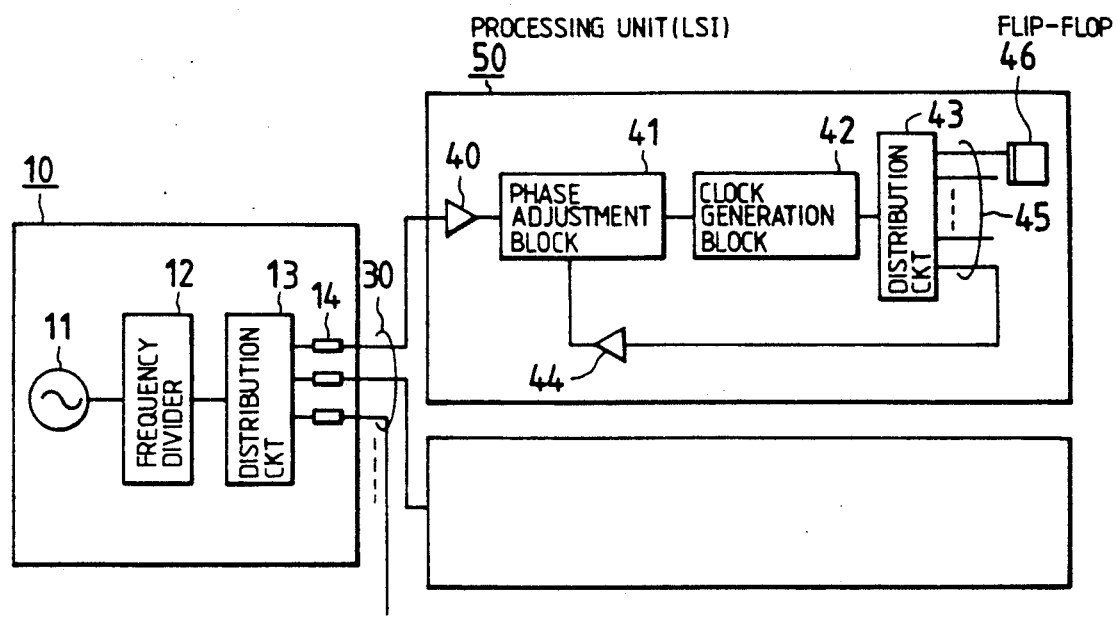
FIG. 1(a) is an overall structural view showing an embodiment of the present invention.

In FIG. 1(a), reference numeral 10 represents a clock signal generator and 50 represents a plurality of processing units as the destinations of the clock signals. The processing units are LSIs. Reference numeral 30 represents signal paths (e.g. wirings on a substrate or cables) connecting the clock signal generator 10 to LSIs 50. Terminal destinations (e.g. flip-flop 46) exist further in each LSI 50.

A high frequency signal generated by an oscillator 11 is frequency-divided to a frequency at which phase adjustment can be made relatively easily, by a frequency divider 12 and is supplied as the clock signal to each LSI 50 through a distributor 13 and the signal path 30. This signal is adjusted precisely by a delay 14 as a phase reference. Hereinafter, this signal will be referred to as the "reference clock". Each LSI 50 consists of a phase adjustment block 41 for adjusting the phases between LSIs, a clock signal generation block 42 for generating multi-phase clock signals used in LSI and a distributor 43 for supplying the signal to the flip-flop 46 as the terminal destination. A dummy input buffer 44 has a delay time substantially equal to that of an input buffer 40 and the clock signal is supplied to it through a wiring 45. The wiring 45 is extended in an equal length from the distributor 43 to each flip-flop 46 or the dummy input buffer 44 as the terminal destination so as to minimize the skew between the destinations. On the other hand, the phase adjustment block 41 adjusts precisely the phases between the output of the input buffer 40 and the output of the dummy input buffer 44. Therefore, the phases between the input of the input buffer 40 (reference clock) and the input of the dummy input buffer 44 or in other words, the input of the flip-flop 46 as the terminal destination, are adjusted. Furthermore, since the phase of the reference clock inputted to each LSI 50 is adjusted, the phase of the input of the flip-flop 46 of each LSI 50 is adjusted and the clock skew between LSIs can be reduced.

Next, the phase adjustment block 41 and the clock generation block 42 will be explained in detail with reference to FIG. 1(b). The phase adjustment block 41 changes the phase of the reference clock by a variable delay circuit 51 and sends it to the clock generation block 42. Part of the clock signal which is generated in the clock generation block 42 and is used in LSI 50 is inputted as a feedback signal from the distribution circuit 43 to the phase comparator 53 from the dummy input buffer 44. The phase comparator 53 compares the phases of the feedback signal with the reference clock and its result is sent to the delay control circuit 52. The delay control circuit 52 provides a signal for controlling the delay time of the variable delay circuit 51. The variable delay circuit 51 changes the phase of the reference clock and sends it to the clock signal generation block 42. The phase of the feedback signal generated as the clock in the clock signal generation block 42 is thus corrected and brought into conformity with the phase of the reference clock.

The clock signal generation block 42 measures the delay time of the variable delay circuit group 56 by a delay time detection circuit 58. This measurement result is sent to the delay control circuit 57 so that the delay time of the variable delay circuit 60 is controlled to a predetermined value. The clock generation circuit 55 generates the multi-phase clock to be used in LSI by use of the output signal at each stage of the variable delay circuit 60 and the reference clock.

In this embodiment the phase of the reference clock signal supplied to each LSI must be adjusted precisely. It has been necessary conventionally to adjust all the phases of the multi-phase clock signals used inside LSIs. But in this embodiment, all the phases of the multi-phase clock signals can be adjusted by adjusting only one phase so that the number of adjustment steps can be reduced. Since the phases coupled to the flip-flop 46 as the terminal destination can be aligned clock skew can be reduced.

Hereinafter, the construction of each circuit in the phase adjustment block 41 and clock generation block 42 will be described in detail.

First of all, the clock generation block 42 in FIG. 1 will be explained.

Figure 1B:
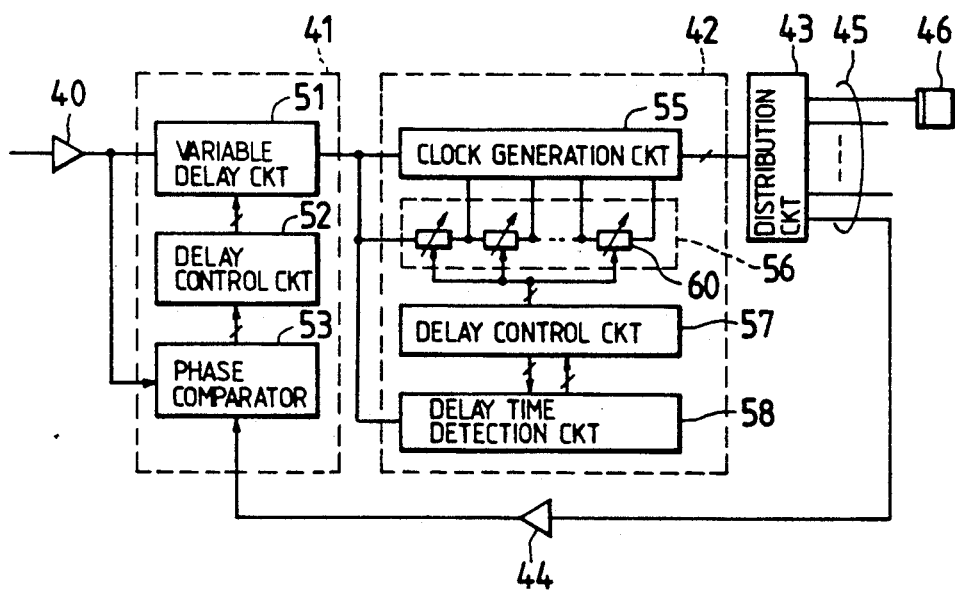
FIG. 1(b) is a detailed view of FIG. 1(a)
Figure 4:
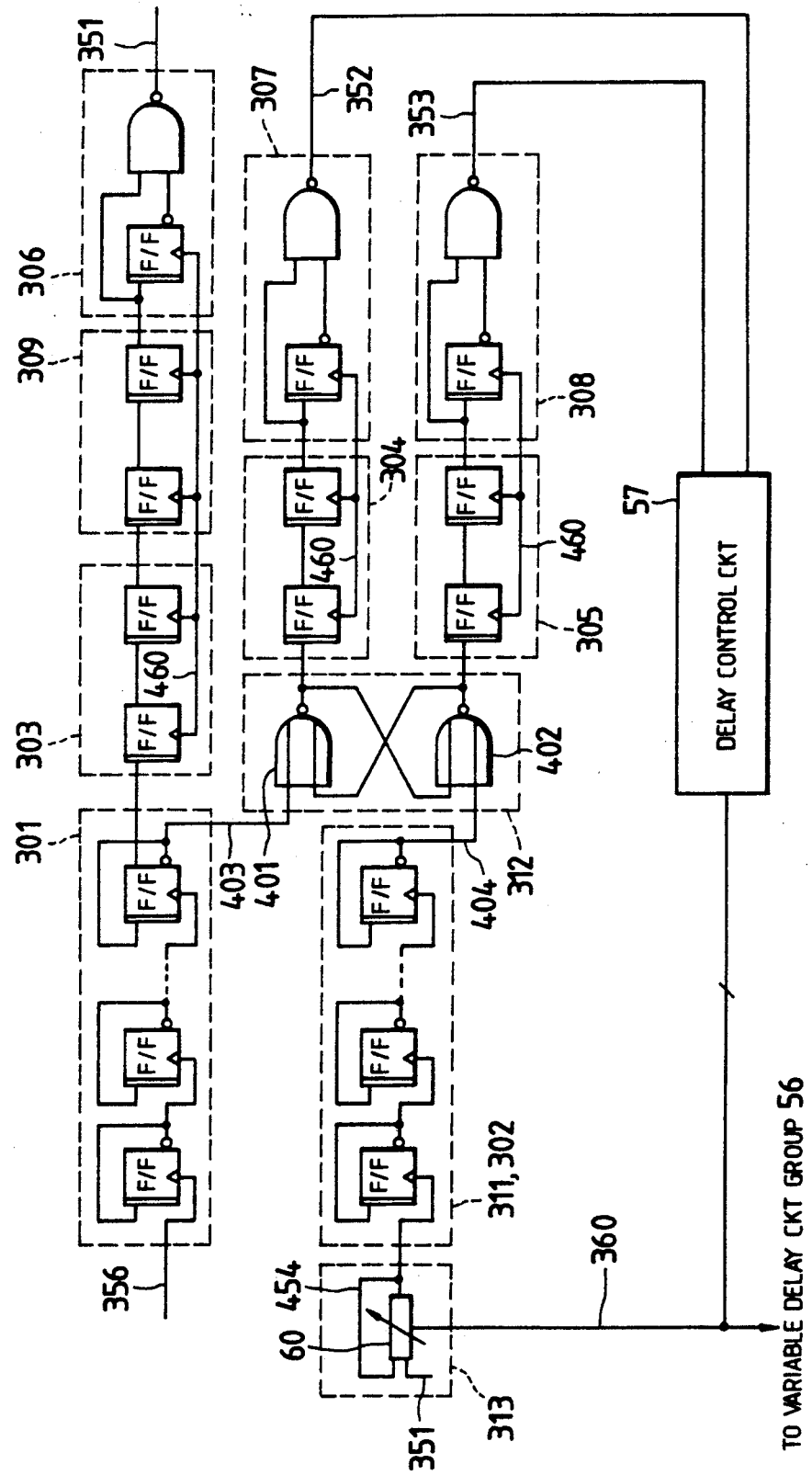
FIG. 4 is a detailed view of FIG. 3.

FIG. 3 is a block diagram showing an example of the delay time detection circuit 58 shown in FIG. 1(b). In this embodiment the output of the variable delay circuit 60 of the variable delay group in FIG. 1 is an inversed signal of the input, and it is used as a variable frequency local oscillator 313 by connecting the input and output terminals of the variable delay circuit 60 which is the same variable delay circuit used in the variable delay group 56 by wirings 454 as shown in FIG. 4. A terminal 356 is the output of the phase adjustment block 41 in FIG. 1 and the phase-adjusted block signal is inputted to frequency divider 301. In other words, the reference clock signal is inputted having a frequency which is a fraction of the signal obtained by the variable frequency local oscillator 313 (1/n here) is inputted. The output of the variable frequency local oscillator 313 is divided to the same frequency as the reference clock signal by a 1/n frequency divider 311 and is then frequency-divided by frequency divider. The frequency dividers are used to obtain at their outputs those outputs which have a small error and have a low frequency so that precision phase comparison can be made. After the phases are compared by the phase comparator 312, the comparison result is inputted to the delay control circuit 57 through synchronization circuits 304, 305 and differential circuits 307, 308. The synchronization circuits 304, 305 synchronize the output of the phase comparator 312 with the clock signal used in the delay control circuit 57 and the output signals are turned into pulse signals by the differential circuits 307, 308. The signals at the terminals 352, 353 are outputted once per cycle of the output signal of the frequency divider 301 or 302. Furthermore, the delay control circuit 57 outputs a control signal 360 and controls the oscillation frequency of the variable frequency local oscillator 313 so that is n times the frequency of the reference clock. Here, the control signal 360 is a multiple-bit signal.

On the other hand, the synchronization circuit 303, a fixed delay circuit 309 and the differential circuit 306 generate a reset signal which resets the variable frequency local oscillator 313 and the frequency dividers 301, 302, 311 through the terminal 351. The fixed delay circuit 309 is disposed for the timing adjustment so that the reset signal generated after the phase comparison result is outputted to the terminals 352, 353.

All the signals described above can be digitized. The delay time detection circuit 58 shown in FIG. 3 is the circuit for adjusting the delay time of the variable delay circuit 60 shown in FIG. 1. Accordingly, if the control signal 360 of the delay control circuit 57 is fixed after this adjustment and oscillation of the variable frequency local oscillator 313 is stopped, the high frequency signal can always be handled in each LSI as the destination, and reliability can be improved.

FIG. 4 is a circuit diagram of the delay time detection circuit 58 shown in FIG. 3. Each of the frequency dividers 301, 302, 311, the synchronization circuits 303-308 and the fixed delay circuit 309 are an edge trigger flop-flip. The reference clock or relatively slow clock signal having a longer period than the reference clock is supplied to the clock signal input terminal 460 of each of the synchronization circuits 303-305, the differential circuits 306-308 and the fixed delay circuit 309. The reset terminals of the frequency dividers 301, 302, 311 are connected to the terminal 351 though they are omitted from illustration. The same circuit as the variable relay circuit 60 shown in FIG. 1 is used as the variable frequency local oscillator 313 with its input and output terminals connected by the wiring 454. The control signal 360 from the delay control circuit 57 is inputted to the frequency local oscillator 313 and to each variable delay circuit 60 of the variable delay circuit group 46 so as to control the delay time, respectively.

Reference numeral 351 represents the reset terminal to which the output of the differential circuit 306 is inputted. Here the variable delay circuit 60 is considered as a one-stage circuit whose output is the inversion signal of its input, but it may consist of a plurality of stages so long as the sum is an odd-numbered to produce the aforementioned inverted signal. If the output of the variable delay circuit 60 is not the inverted signal of its input signal, the construction may be changed in such a manner as to invert the output by disposing an inverter or the like in the variable frequency local oscillator 313. The phase comparator 312 consists of NOR circuits 401, 402. When the signal at the terminal 403 falls earlier than the signal at the terminal 4044, the output of the NOR circuit 401 rises from the low level to the high level but the output of the NOR circuit 402 remains at the low level. Furthermore, the pulse signal is generated from only the terminal 352 through the synchronization circuits 304, 305 and the differential circuits 307, 308 and the terminal 353 remains at the high level. If the phase of the terminal 404 is earlier than the phase of the terminal 403, the pulse signal is generated from only the terminal 353. The 1/n frequency divider 311 determines n in accordance with the frequency of the reference clock and that of the signal of the terminal 454. If the input signal at the terminal 356 (reference clock signal) is ¼ of the frequency of the variable frequency local oscillator 313, for example n=4 and this can be accomplished by two stages of flip-flops. When n is not $2^m$ (m: positive integer), the frequencies of the signals at the terminals 403 and 404 can be aligned by changing the structures of the 1/n frequency divider 311 and frequency dividers 301, 302. The number of stages of the flip-flops of the frequency dividers 301, 302 is set so that the cycle time of the signals at the terminals 403, 404 is relatively long and the comparison error of the phase comparator 312 or the like can be neglected.

Figure 5:
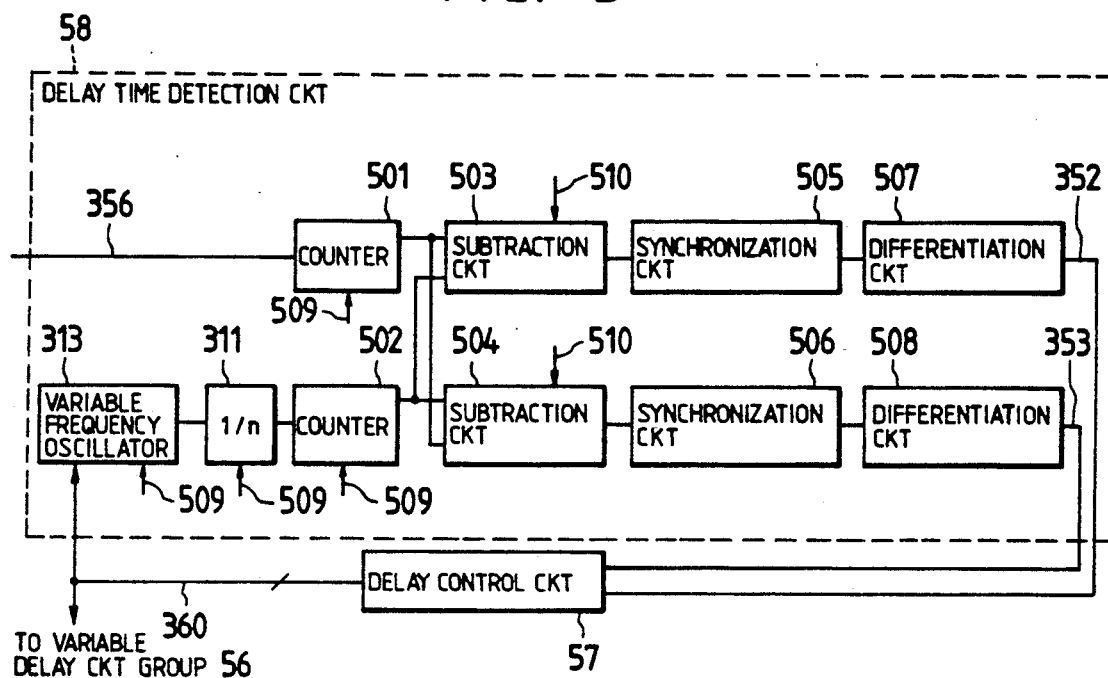
FIG. 5 is a block diagram showing another example of the delay time detection circuit.

FIG. 5 is a block diagram showing another example of the delay time detection circuit 58. The outputs from the terminal 356 and 1/n frequency divider 311 are inputted to the counters 501 and 502, respectively, and the number of pulses is counted. A subtraction circuit 503 uses the output of the counter 501 as the minuend and the output of the counter 502 as the subtrahend. The output of the subtraction circuit 503 is a sign bit. When the output of the counter 501 is greater than that of the counter 502, the sign bit changes from the low level to the high level. Similarly, a subtraction circuit 504 uses the output of the counter 502 as the minuend and the output of the counter 501 as the subtrahend, and when the former is greater than the latter, the output is switched from the low level to the high level. The outputs of the subtraction circuits 503, 504 are inputted to the delay control circuit 57 through the synchronization circuits 505, 506 and the differential circuits 507, 508 in the same way as in the embodiment shown in FIG. 3. Here, the signal at the terminal 510 is generated by use of a timer circuit or the like and when the count number of each counter 501, 502 is produced the calculation result of the subtraction circuit is read in. The signal at the terminal 509 is a reset signal and is generated after the calculation result of the subtraction circuit is read. This circuit construction also provides the advantages which re the same as those of the embodiment shown in FIG. 3.

Next, the clock generation circuit 55 shown in FIG. 1(b) will be explained. The clock generation circuit 55 generates the clock signals used in LSIs by use of the reference clock whose phase is adjusted by the phase adjustment block 41 and the output signal of each series connected variable delay circuit 60.

Figure 6A:
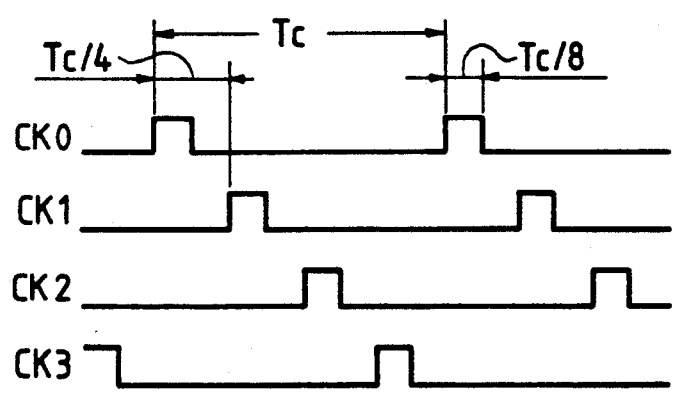
FIGS. 6(a) to 6(c) show examples of clock signals useful for explaining the present invention.
Figure 6B:
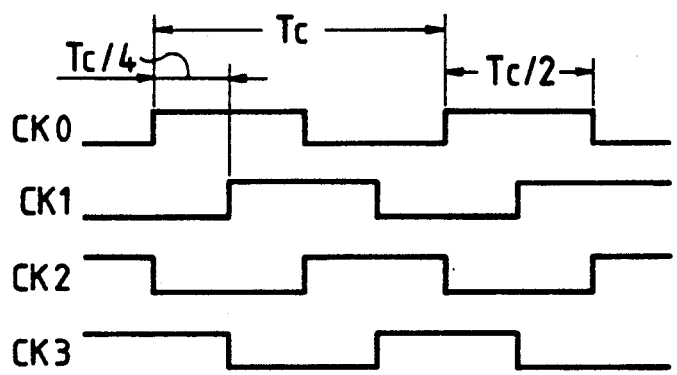
Figure 6C:
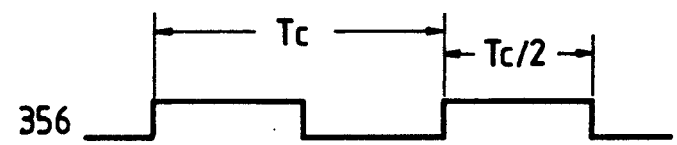

The description will be given hereby where 4-phase clock signals CK0-CK3 are generated as shown in FIG. 6(a) or 6(b). It is assumed that in both FIGS. 6(a) and (b), the machine cycle is Tc, the delay time is Tc/4 and the 4-phase clock signals have the pulse widths of Tc/8 and Tc/2, respectively. The clock signal in FIG. 6(a) has a small pulse width and eliminates the problem that when the clock generation circuit 10 in accordance with the prior art method shown in FIG. 2 distributes the clock signals to each processing unit 20 from the clock generation circuit 10 a sufficient amplitude cannot be obtained. This embodiment is particularly effective for such a case. FIG. 6(c) shows the reference clock signal 356. The machine cycle and the pulse width are assumed to be Tc and Tc/2, respectively. First of all, FIG. 7 will be explained as an example of the circuit for generating the clock signals shown in FIG. 6(a).

Figure 7A:
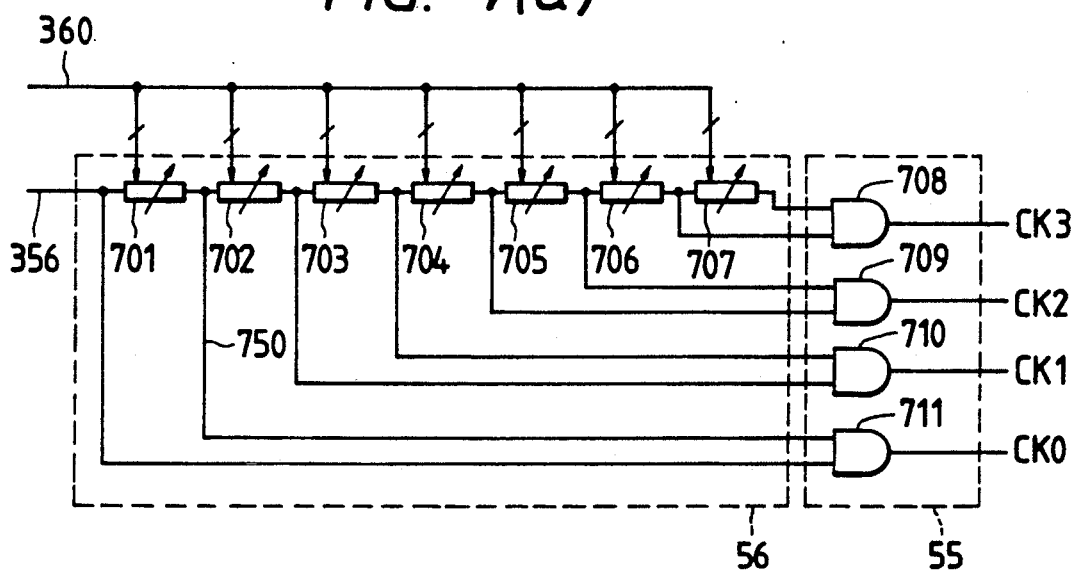
FIG. 7(a) is a structural view showing an example of a clock generation circuit used in the present invention.
Figure 7B:
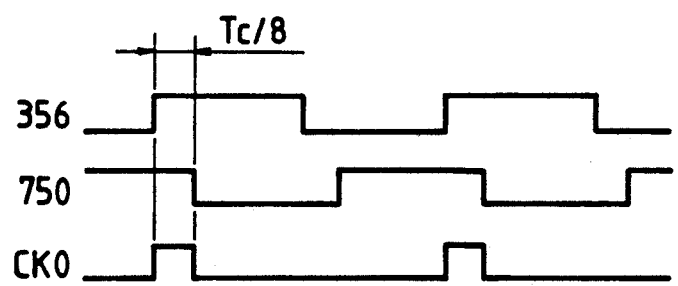
FIG. 7(b) is a waveform diagram of FIG. 7(a)

In FIG. 7, (a) shows a circuit diagram and FIG. 7(b) shows the input signal to the terminal 356 (phase-adjusted reference clock signal) and the signals to the terminals 750 and CK0 for explaining the operation of the circuit. The variable delay circuit group 56 consists of the variable delay circuits 701-707 and the clock generation circuit 55 consists of AND circuits 708-711. The variable delay circuit group 56 inputs the control signal 360 which is the same as the frequency local oscillator 313 (variable delay circuit 60) shown in FIGS. 3, 4 or 5. Since the delay time of the variable delay circuit 60 constituting the frequency local oscillator 313 shown in FIGS. 3, 4, 5 or 6 and the delay time of the variable delay circuits 701-707 must be made equal to one another, the variable delay circuit group 56 is disposed in the proximity of one another inside LSI 50 so as to prevent any adverse influences resulting from variance of production. The signal at the terminal 356 is the output signal of the phase adjustment block 41 of FIG. 1 and the phase-adjusted reference clock signal shown in FIG. 6(c) is inputted. This signal is delayed by Tc/8 by the variable delay circuit 701 and is further inverted to obtain the signal at the terminal 750. The signals at the terminals 356 and 750 are inputted to the AND circuit 711, thereby generating the clock signal CK0. The signals CK1-CK3 are generated likewise by use of the variable delay circuits 702-707 and the AND circuits 708-710, respectively.

This embodiment can generate the multiple phase clock signals CK0-CK3 by use of the reference clock signal whose phase is adjusted by the phase adjustment block 41 and the outputs of each stage of the variable delay circuits 701-701 having the accurate delay time controlled by the delay control circuit 57. If the clock signal CK0 is sent as the feedback signal to the phase adjustment block 41 in FIG. 1 and its phase is precisely adjusted by the same 41, the phases of CK1-CK3 generated by precisely delaying CK0 by the variable delay circuit group 56, whose delay time is precisely adjusted by the delay control circuit 57, are adjusted precisely so that the clock skew can be reduced for each phase.

In the circuit shown in FIG. 7(a), the phase-adjusted reference clock is delayed by TC/8 by each of the variable delay circuits 701-707. Therefore, if the delay time of the variable delay circuit is deviated from Tc/8, the delay time from the rise edge of CK0 to the rise edge of CK3 is 6×(Tc/8) and the deviation is multiplied by 6. Therefore, a circuit such as shown in FIG. 8 is devised.

Figure 8:
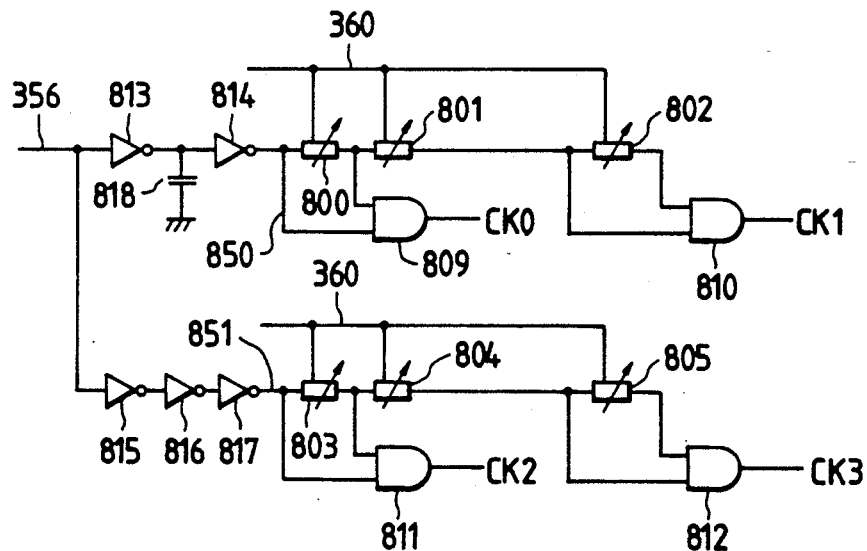
FIG. 8 is a structural view showing another example of the block signal generation circuit used in the present invention.

In FIG. 8, the signal at the terminal 356 is the output signal of the phase adjustment block 41 shown in FIG. 1 in the same way as in FIG. 7 and the phase-adjusted reference clock signal shown in FIG. 6(c) is inputted. This signal is used to generate two-phase signals 850, 851 whose phases deviate by 180° by inverters 813-817 and a load capacitance 818. If the delay time due to the load capacitance 818 is equal to the delay time due to the inverter 816, the signal at the terminal 851 becomes the accurate inversion signal of the signal at the terminal 850. These signals are delayed by Tc/8 by each variable delay circuit 800-805 and CK0-CK3 are generated by the AND circuits 809-812. The variable delay circuits 800-805 input the same control signal 360 as that of the frequency local oscillator 313 (variable delay circuit 60) shown in FIGS. 3, 4 or 5. In this case, the maximum value of deviation of the delay time between the phases of the clock signal is the sum of the value twice the deviation from Tc/8 of the variable delay circuit and the difference between the delay time due to the load capacitance 818 and the delay time due to the inverter 816. The circuit which has a smaller maximum value of the deviation depending on the desing condition may be selected as the circuit shown in FIGS. 7 and 8.

Figure 9:
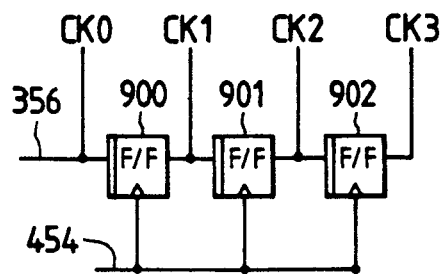
FIG. 9 is a structural view showing still another example of the clock signal generation circuit used in the present invention.

FIG. 9 shows the circuit for generating the clock signals CK0-CK3 of FIG. 6(b) and this circuit functions as the clock generation circuit 55 of FIG. 1 and also as the variable delay circuit group 56. This embodiment does not use the variable delay circuit 60 such as shown in FIG. 1(b). Since the delay time between the phases of the clock signals CK0-CK3 changes by changing the signal at the terminal 454 in the edge trigger flip-flops 900-902, it functions as a variable delay circuits. The signal at the terminal 356 is the output signal at the phase adjustment block 41 in FIG. 1 and the phase-adjusted reference clock signal shown in FIG. 6(c) is inputted. The clock signals CK0-CK3 are generated by shifting the reference clock signal by the edge trigger flip-flops 900-902. The signal at the terminal 454 is the output signal of the variable frequency local oscillator 313 shown in FIGS. 3, 4 or 5. The cycle time is Tc/4. The signals CK0-CK3 shown in FIG. 6(b) can be obtained by forming the variable delay circuits whose delay time is Tc/4 and connecting them in series as shown in FIG. 7. In this case, the variable delay circuits connected in series are in three stages, and n of the 1/n frequency divider shown in FIG. 4 is 2 and the flip-flop is one stage.

As described above, an arbitrary low frequency multi-phase clock can be generated by inputting one phase of the reference clock signal whose phase is accurately adjusted by the phase adjustment block 41 by generating the clock signals which are accurately delayed inside the LSI by changing of the delay time of variable delay circuits 56 and the construction of a clock generation circuits 55.

Figure 10:
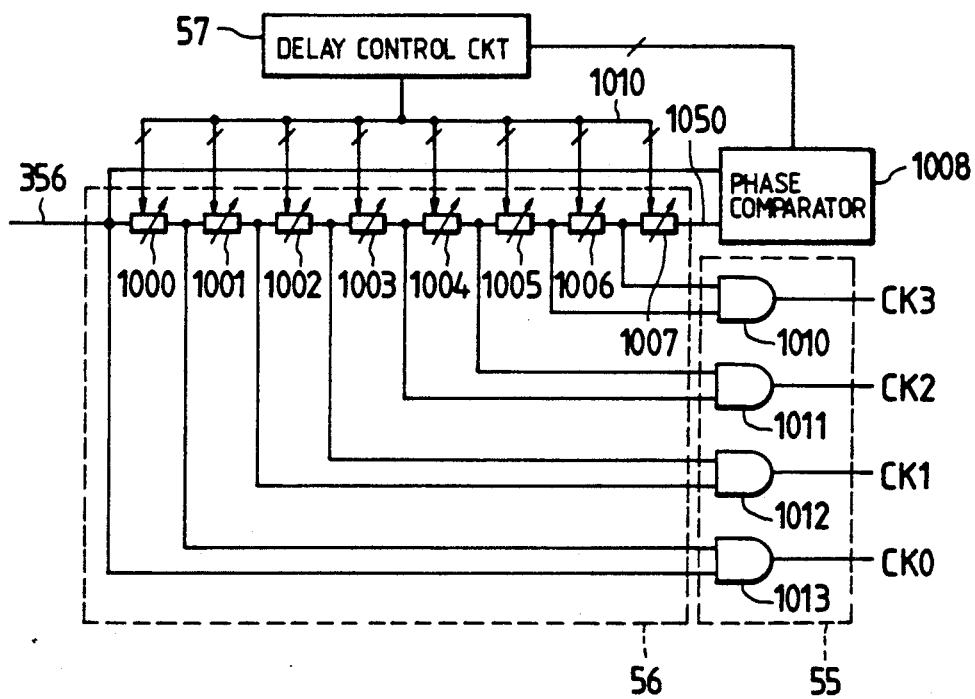
FIG. 10 is a structural view showing still another example of the clock signal generation block used in the present invention.

FIG. 10 shows another example of the clock generation block 42 shown in FIG. 1 which has a circuit construction for generating the clock signals CK0-CK3 of FIG. 6(a). The signal at the terminal 356 is the output signal of the phase adjustment block 41 of FIG. 1. The phase-adjusted reference clock signal of FIG. 6(c) is inputted at terminal 350. The phase comparator 1008 corresponds to the delay time detection circuit 58 shown in FIG. 1(b). The clock generation circuit 55 consists of the AND circuits 1010-1013 in the same manner as in FIG. 7. In this embodiment the outputs of the variable-delay circuits 1000-1007 are the inversion of the signals at the inputs. Though the delay time may be set to (⅛)Tc, it is hereby considered as (9/8)Tc. Then, the delay time from the terminal 356 to the terminal 1050 is 9Tc. The signals at the terminals 1050 and 356 are inputted to the phase comparator 1008 and the result of comparison is inputted to the delay control circuit 57. The control signal from the delay control circuit 57 is inputted to all of the variable delay circuits 1000-1007 to bring the phases at the terminals 1050 and 356 into conformity with each other. The clock generation circuit 55 generates the clock signals CK0-CK3 by use of the outputs of the variable delay circuits 1000-1007 having the delay time (9/8)Tc and the reference clock at the terminal 356 in the same way as in FIG. 7. The delay time from the terminal 356 to the terminal 1050 is designed in consideration of variance of the variable delay circuits 1000-1007 due to processing. The delay time has a variable width to a certain extent from 9Tc. There is the possibility that the delay time from the terminal 356 to the terminal 1050 becomes 8Tc or 10Tc. Since the cycle time of the reference clock signal at the terminal 356 is Tc, the phases are in alignment. Therefore, the edge with which the phase must be aligned can be specified by setting the cycle time of the reference clock signal to a multiple of 9Tc only at the time of adjustment of the variable delay circuits 1000-1007. The cycle time of the reference clock signal may be returned to Tc after this adjustment. The multi-phase clock signals can be generated by changing the circuit construction of the clock generation circuit 55 for other delay times than the delay time (9/8)Tc described above. This also holds true for the case where the outputs of the variable delay circuits 1000-1007 are not the inversion of the signals of the inputs. If the pulse width of the resulting clock signals CK0-CK3 is small or the delay time between the phases is small, the embodiment shown in FIG. 7 needs to reduce the delay time of the variable delay circuits 701-707. Therefore, it becomes difficult to design a circuit construction having high resolution. This problem does not occur in this embodiment because the delay time of the variable delay circuits 1000-1007 can be increased to a value as great as (9/8)Tc, for example.

Figure 11A:
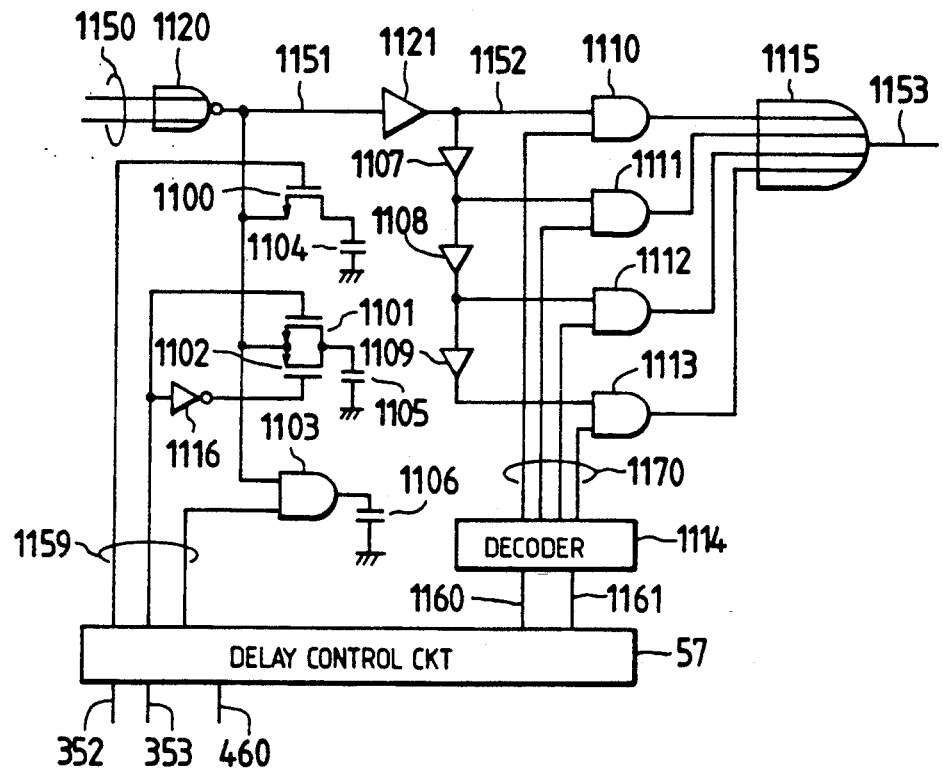
FIG. 11(a) is a structural view showing an example of a variable delay circuit used in the present invention.
Figure 11B:
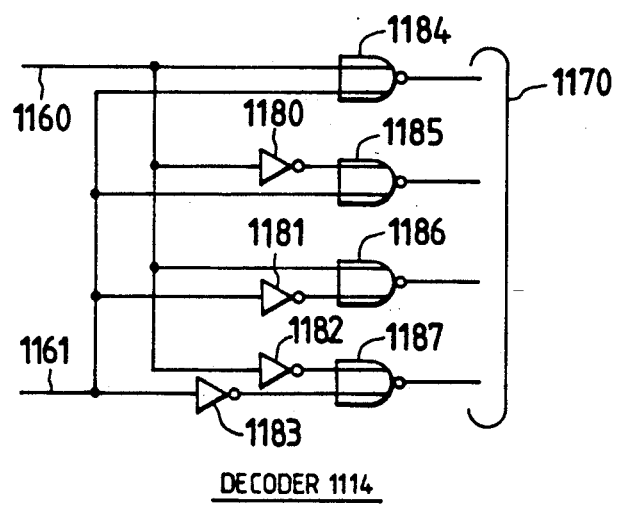
FIG. 11(b) is a structural view of a decoder of the variable delay circuit.

FIG. 11(a) shows an example of the variable delay circuit 60 forming the variable delay circuit group 56 in FIG. 1 and the variable frequency local oscillator 313 in FIG. 4. When it is used as the variable delay circuit 60 shown in FIG. 1, the clock signal is inputted to one of the input terminals 1150 of the NOR circuit 1120, and a low level signal is inputted to the other input terminal. When it is used as the variable delay circuit 60 in FIG. 4, one of the input terminals 1150 of the NOR circuit 1120 is connected to the output 1153 of the OR circuit 1115 and the other input terminal is used as the reset terminal 351. Two kinds of transfer gates and a logic circuit are connected to the output of the NOR circuit 1120. Reference numeral 1100 represents the transfer gate of an n-MOS, reference numerals 1101 and 1102 are the transfer gates of an n-MOS and a p-MOS, respectively, and reference numeral 1103 is an AND circuit. ON/OFF of the transistors is controlled by the control signal 1159 from the delay control circuit 57 so as to change the load capacitance which is driven by the NOR circuit 1120. The load capacitances 1104-1106 are each formed by the wiring capacitance and the input capacitance and junction capacitance of the transistors. The smaller this capacitance, the higher the resolution of the variable delay circuit. Reference numeral 1116 represents an inverter which inputs the inverted signal from the control signal 1159 to the transfer gate 1102. Logic circuits 1107-1109 which provide delay are connected in series with the logic circuit 1121 and the number of stages of the logic circuits is determined by the control signal 1170 for selecting the AND circuits 1110-1113. The control signal 1170 is generated by a decoder 1114 by use of two-bit outputs 1160, 1161 so that one of the control signals 1170 is at the high level. FIG. 11(b) shows an example of the decoder 1114. Reference numerals 1180–1183 represent inverters. Reference numerals 1184–1187 represent NOR circuits. When the number of two-bit signals 1160, 1161 is high, the number of stages from the logic circuit 1121 to the OR circuit 1115 increases.

Figure 12:
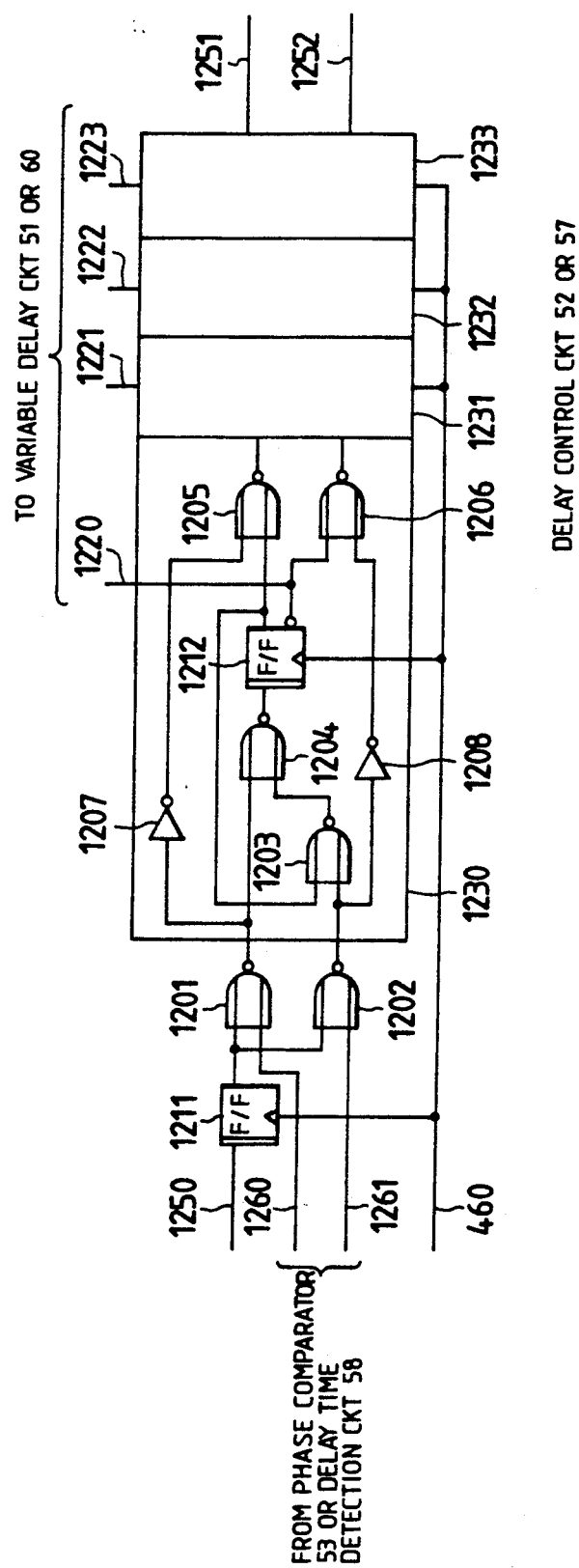
FIG. 12 is a structural view showing an example of a delay control circuit used in the present invention.

Next, FIG. 12 shows an example of the delay control circuits 52, 57 used in the phase adjustment block 41 and clock generation block 42 that are shown in FIG. 1. Unlike an ordinary UP/DOWN counter, these delay control circuits have a construction such that only one of the bits 1220–1223 changes per pulse of the clock signal outputted to the terminal 460. More specifically, only the bit at the extreme left among those bits which can change in correspondence to the instruction inputted to the terminals 1260, 1261 changes. This circuit increases the change of the delay time to shorten the time necessary untill the completion of the phase adjustment while the phase deviation is great immediately after the start of the phase adjustment.

In FIG. 12, reference numerals 1201–1206 represent NOR circuits, 1207 and 1208 are inverters and 1211 and 1212 are edge trigger flip-flops. The circuits inside the delay control blocks 1231–1233 are omitted but are the same as the delay control block 1230. Reference numerals 1260 and 1261 represent terminals to which the results of the phase comparator 53 and delay time detection circuit 58 shown in FIG. 1 are inputted, reference numeral 460 is a terminal to which the clock signal is inputted and reference numerals 1220–1223 are terminals which output the control signals of the variable delay circuits 51, 60 shown in FIG. 1. The binary values represented by the levels of the terminals 1220–1223 are incremented one per pulse of the clock signal inputted to the terminal 460 when the terminal 1260 is at the low level and decremented one per pulse when the terminal 1261 is at the low level. Therefore, for example, when the signal at the terminal 404 falls earlier than the signal at the terminal 403 in FIG. 4 the terminal 1260 is set to the low level so as to increase the delay time of the variable delay circuit 60. When the signal at the terminal 403 falls earlier control decreases the delay time. In this manner the phases of the signals at the terminals 404 and 403 can be aligned with each other.

The signal inputted to the terminal 1250 is for fixing the levels at the terminals 1220–1223 and for stopping the control of the delay time of the variable delay circuit 51 or 60. Since in the clock generation block 42 in FIG. 1 the delay time is adjusted by use of the output from the phase adjustment block 41, the control of the phase adjustment block 41 is stopped while the clock generation block 42 adjusts the delay time of the variable delay circuit 60. After the adjustment of the clock adjustment block 42, the control of the clock generation block 42 is stopped and the phase adjustment by the phase adjustment block 41 is started. Since almost all the circuits do not exhibit time varying operation before the start of the supply of the clock signals CK0–CK3, the noise occurring inside the computer is at most the ripple of the power source. When the supply of the clock signals CK0–CK3 is started, a large number of circuits start operating simultaneously and substantial electrical noise occurs. Therefore, the clock signals CK0–CK3 are not supplied at the first stage to the destination 46. The phase adjustment mechanism is actuated and after the phase adjustment is complete, the terminal 1250 is set to the low level so as to stop the change of the control signals of terminals 1220–1223. Thereafter the supply of the clock signals CK0–CK3 is started. In this manner the phase adjustment can be carried out without being effected by the high noise level and the clock skew can be reduced. The detection method of the completion of the adjustment in the phase adjustment block 41 and in the clock generation block 42 can be accomplished by waiting sufficiently for the completion by use of a timer circuit.

The terminals 1251 and 1252 are connected to the set and reset terminals of the edge trigger flip-flop (1212 in the block 1230) in each delay control block 1230–1233 encompassed by solid lines. When the terminal 1260 falls to the low level while all the terminals 1220–1223 are at the high level, the terminal 1251 rises to the high level and sets the flip-flop and the terminals 1220–1223 fall to the low level. When the terminal 1261 falls to the low level while all the terminals 1220–1223 are at the low level, the terminal 1252 rises to the high level to set the flip-flop and the terminals 1220–1223 rise to the high level. Accordingly, if the variable delay circuit 51 or 60 has a sufficient variable width, the phase adjustment can be made irrespective of the initial state of the control signals 1220–1223 of the variable control circuits. The control signals 1220–1223 of the variable delay circuit in FIG. 12 have four bits, but the number of bits can be increased or decreased by increasing or decreasing the number of delay control blocks 1230–1233 encompassed by the solid lines.

The variable delay circuit 51 of the phase adjustment block 41 in FIG. 1 uses the NOR circuit 1120 in the circuit shown in FIG. 11 by changing it to a suitable logic circuit and the delay control circuit 52 uses the circuit shown in FIG. 12.

Figure 13A:
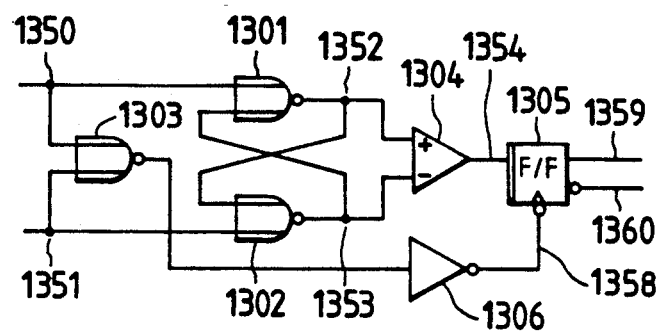
FIGS. 13(a) and 13(b) are a structural view showing an example of a phase comparison circuit used in the present invention and its operation waveform diagram, wherein hatched portions in FIG. 13(b) represent a high or low level.
Figure 13B:
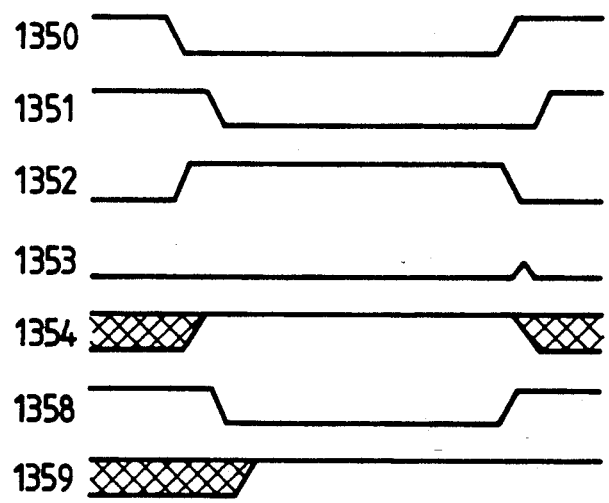

FIG. 13(a) shows an example of the phase comparator 53 and FIG. 13(b) shows an example of its operation waveforms.

In FIG. 13(a), reference numerals 1301–1303 represent NOR circuits, reference numeral 1304 is a differential circuit, reference numeral 1305 is a flip-flop and reference numeral 1306 is an inverter. Reference numeral 1350 represents a terminal for inputting the feedback signal and reference numeral 1351 represents a terminal for inputting the reference clock. The phase of these two signals are compared. It is assumed that the phase of the signal inputted to the terminal 1350 is earlier than the phase of the signal inputted to the terminal 1351. In this case, while both of the signals inputted to the terminals 1350 and 1351 are at the high level, the voltages at both the terminals 1352 and 1353 are at the low level. However, since the fall of the signal inputted to the terminal 1350 occurs earlier than the fall of the signal inputted to the terminal 1351, the voltage at the terminal 1352 starts rising earlier than the voltage at the terminal 1353. As a result, after the passage of a certain predetermined period from the falling edge of the signals inputted to the terminals 1350, 1351, the voltage at the terminal 1352 is at the high level and the voltage at the terminal 1353 is at the low level and this state becomes stable. Therefore, the voltage at the output terminal 1354 of the differential circuit 1304 rises to the high level. If the time relationship of the signals inputted to the terminals 1350 and 1351 is the opposite, the voltage at the terminal 1354 is at the low level. Accordingly, after the passage of a certain predetermined period from the falling edge of the signals inputted to the terminals 1350 and 1351, the levels of the output terminals 1359 and 1360 can be determined in accordance with the time relationship of the signals inputted to the terminals 1350 and 1351 by applying the level of the terminal 1354 into the flip-flop 1305. Thereafter, the levels of the terminals 1359 and 1360 do not change until the time relationship of the signals inputted to the terminals 1350, 1351 inverts. Circuits analogous to the differential circuits 307, 308 are connected to the terminals 1359, 1360 which send pulse signals to the delay control circuit 52.

In the embodiment shown in FIG. 13(a), the signal at the terminal 1358 falls to the low level when both the signals at the terminals 1350 and 1351 are at the low level and the flip-flop 1305 is triggered. Therefore, when the signals at the terminals 1350 and 1351 are the reference clock shown in FIG. 6(c) and the clock signal CK0 shown in FIG. 6(a) and have the timings shown in FIG. 14(a), respectively, the flip-flop 1305 is triggered at the time $t_0$ and at the time $t_1$, respectively. When the falling of the signal at the terminal 1354 is substantially simultaneous with the falling of the signal at the terminal 1358 as shown in FIG. 14(c), the flip-flop 1305 is in a meta-stable state where the output is not fixed to the high or low level for a long period. In such a case, the values of the outputs 1359, 1360 of the flip-flop 1305 are not definite and there is the possibility that the control stops under this state. Accordingly, the feedback signal of CK0 must be set to the waveform similar to the reference clock signal (duty: approx. 50%) and then inputted to the phase comparator 53. When the signals at the terminals 1350 and 1351 fall substantially simultaneously (FIG. 14(b)), the flip-flop enters the meta-stable state due to the NOR circuits 1301, 1302. In this case, no problem occurs even if the control stops because the phases of the signals of the terminals 1350 and 1351 are in agreement.

Figure 15:
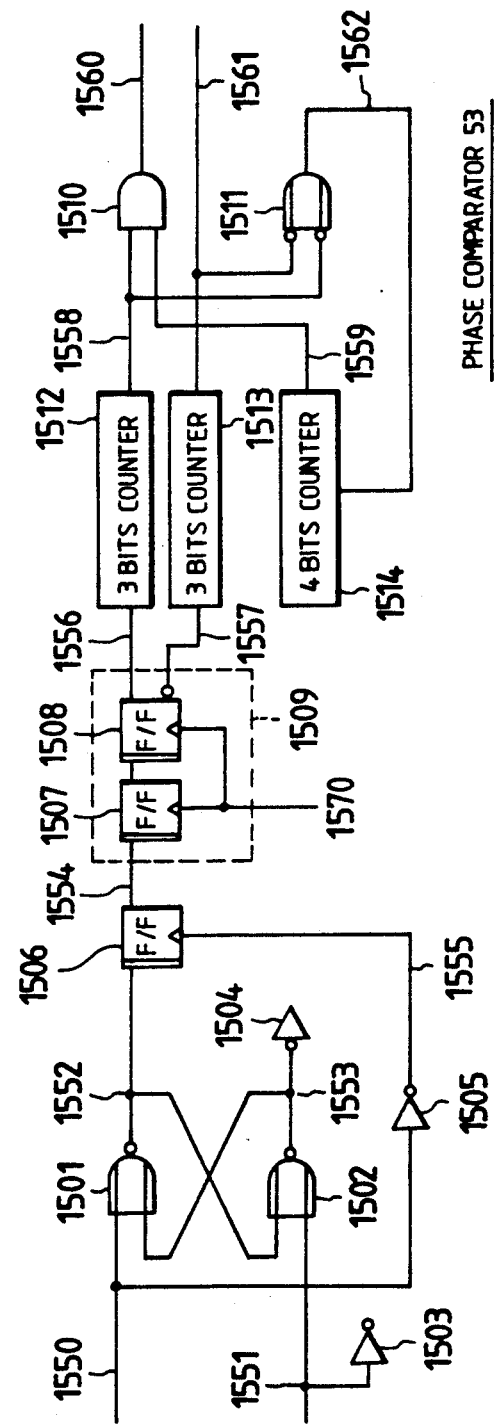
FIG. 15 is a structural view showing another example of the phase comparison circuit used in the present invention.

FIG. 15 shows another example of the phase comparator 53 which operates for the inputs having different pulse widths described above. In FIG. 15, reference numerals 1501 and 1502 represent NOR circuits, reference numerals 1503-1505 are inverters, reference numerals 1506-1508 are flip-flops, reference numeral 1509 is a synchronization circuit, reference numeral 1510 is an AND circuit and reference numeral 1511 is a NAND circuit. In the same way as in FIG. 13, reference numerals 1550 and 1551 represent the terminal for inputting the feedback signal and the terminal for inputting the reference clock, respectively. The phases of these two signals are compared. The inverters 1503 and 1504 are for aligning the loads at the terminals 1550, 1551 and at the terminals 1552, 1553, respectively. The trigger signal of the synchronization circuit 1509 inputted to the terminal 1570 is either the reference clock or a relatively slow signal having a longer period than the former. Three-bit counters 1512, 1513 output the low level once per predetermined period when the terminal 1556 or 1557 outputs continuously the low level. While this output is awaited, the control signal of the variable delay circuit 52 is changed in accordance with the result of phase comparison and the phase of the feedback signal is adjusted.

Figure 14A:
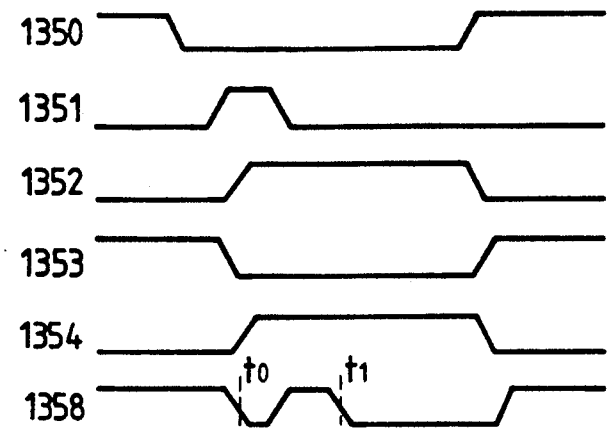
FIGS. 14(a) to 14(c) are timing charts useful for explaining the meta-stable state occurring in the circuit shown in FIG. 13(a)
Figure 14B:
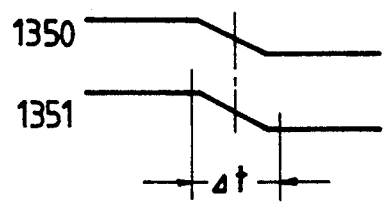
Figure 14C:
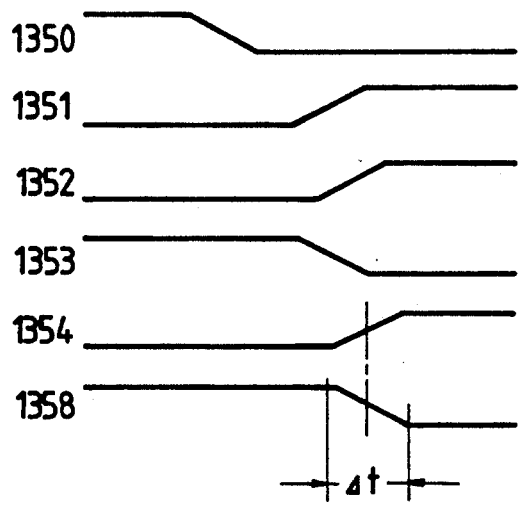

Since this embodiment uses the inverted signal of the terminal 1550 as the trigger for the flip-flop 1506, the trigger does not occur twice per cycle unlike the signal at the terminal 1358 of FIG. 14(a). However, in the same way as in the embodiment shown in FIG. 13(a), this embodiment has the possible operation that the flip-flop 1506 enters the meta-stable state depending on the timing of the signals at the terminals 1552 and 1555 and the control stops under this state. The synchronization circuit 1509, etc., addresses this problem. The synchronization circuit 1509 synchronizes the signals at the terminals 1556 and 1557 with the trigger signal at the terminal 1570 even when the flip-flop 1506 is under the meta-stable state. The signals at the terminals 1556, 1557 are determined depending on the state of the flip-flops 1506-1508. There is the possibility that they do not reach continuously the low level. At this time the output of the 3-bit counter remains at the high level. Therefore, if the 3-bit counters 1512, 1513 do not output the low level within a predetermined period of time, the 4-bit counter 1514 outputs the low level so that the flip-flop 1506 escapes from the meta-stable state. When either one of the 3-bit counters 1512 and 1513 outputs the low level, the reset signal is generated by the NAND circuit 1511 at the terminal 1562 and the output of the 4-bit counter 1514 remains at the high level.

Figure 16:
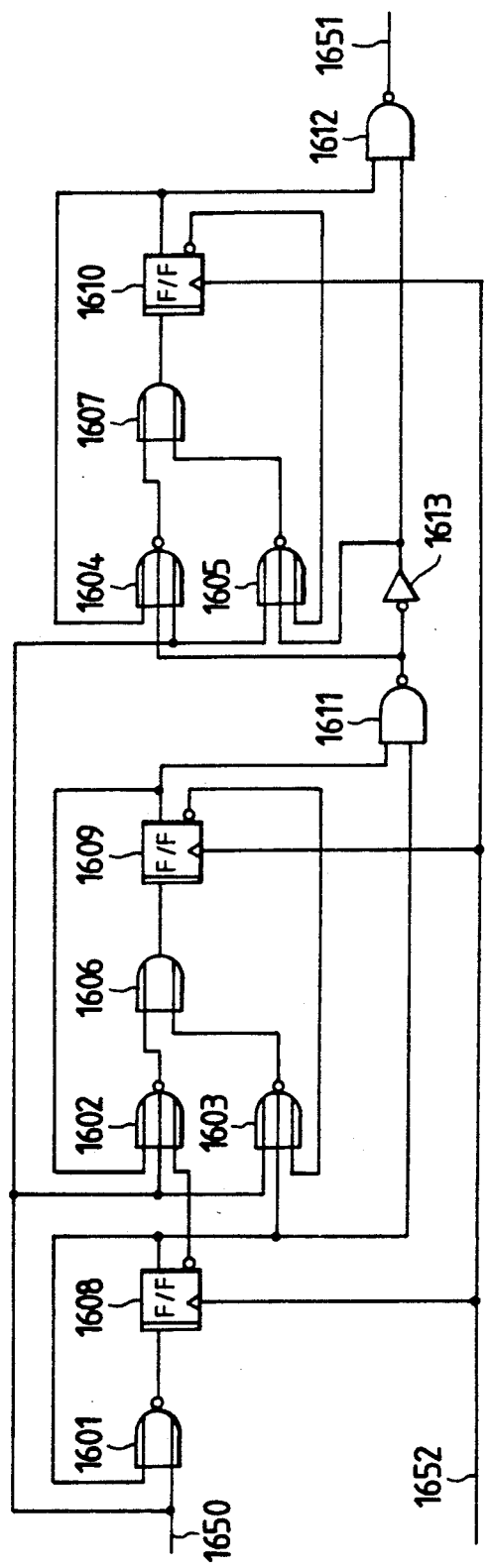
FIGS. 16 and 17 are circuit diagrams of a three-bit counter and a four-bit counter of FIG. 15, respectively.

FIG. 16 shows a structural view of the 3-bit counter 1512 or 1513 used in FIG. 15. In FIG. 16, reference numerals 1601-1605 identify NOR circuits, reference numerals 1606 and 1607 identify OR circuits, reference numeral 1608-1610 identify flip-flops, reference numerals 1611 and 1612 identify NAND circuits and reference numeral 1613 identifying an inverter. The terminal 1650 connects the terminal 1556 or 1557 in FIG. 15 and the terminal 1651 becomes the terminal 1560 or 1561 in FIG. 15. The same input signals as those of the flip-flops 1507, 1508 in FIG. 15 which are inputted as the trigger signals of the flip-flops 1608-1610. The operation is the same as an ordinary counter circuit. When the low levels are continuously inputted to the terminal 1650, it outputs the low level to the terminal 1651 once per 8 cycles of the trigger signal of the terminal 1652.

Figure 17:
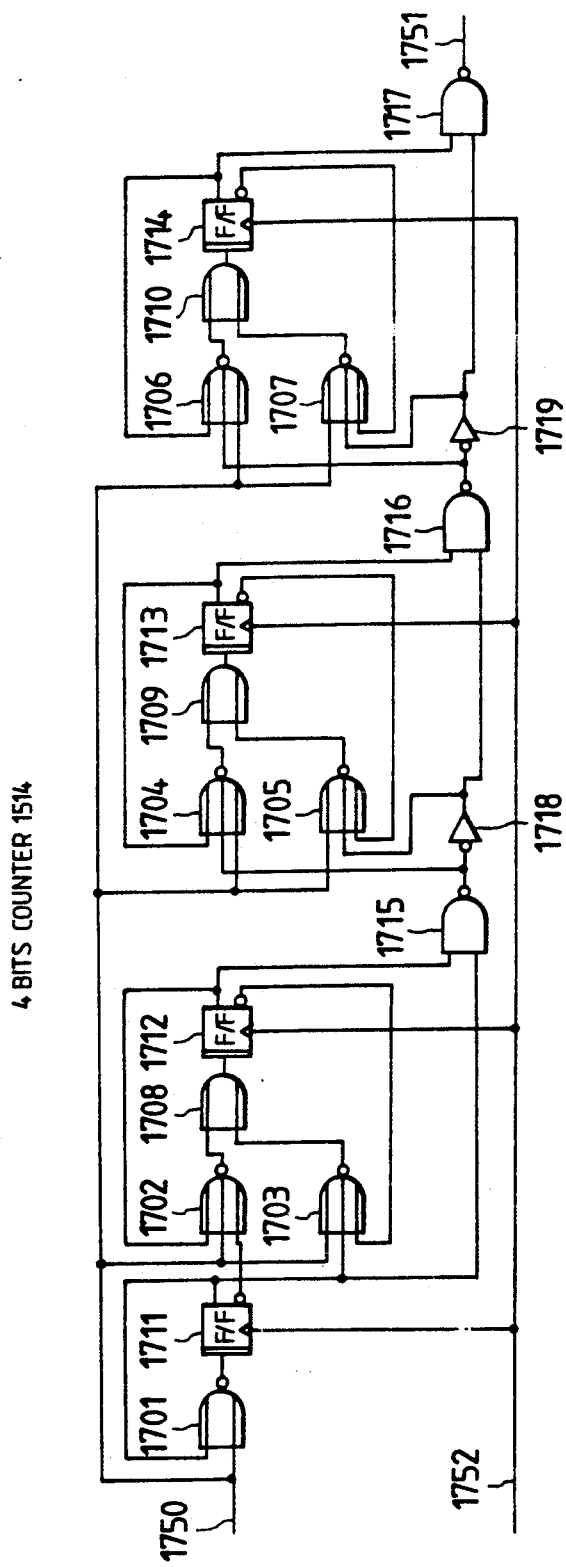

FIG. 17 is a structural view showing an example of the 4-bit counter 1514 used in FIG. 15. In the drawing, reference numerals 1701-1707 represent NOR circuits, reference numerals 1708-1710 are OR reference numerals circuits, 1711-1714 are flip-flops, reference numerals 1715-1717 are NAND circuits and reference numerals 1718 and 1719 are inverters. A terminal 1750 connects the terminal 1562 in FIG. 15 and a terminal 1751 becomes the terminal 1559 of FIG. 15. The same signals as those of the flip-flops 1507, 1508 are inputted as the trigger signals of the flip-flops 1711-1714. The operation is the same as an ordinary counter circuit. When the low levels are inputted continuously to the terminal 1750, it outputs the low level to the terminal 1751 once per 16 cycles of the trigger signal of the terminal 1752. In other words, when the 3-bit counter 1512 or 1513 outputs the low level, the terminal 1750 rises to the high level and this 4-bit counter is reset. If the 3-bit counter 1512 or 1513 remains continuously at the high level, the terminal 1751 outputs the low level.

The phase comparator of this embodiment can output the phase comparison result of the two signals described above irrespective of the waveforms of the reference clock and feed-back signal.

Figure 18:
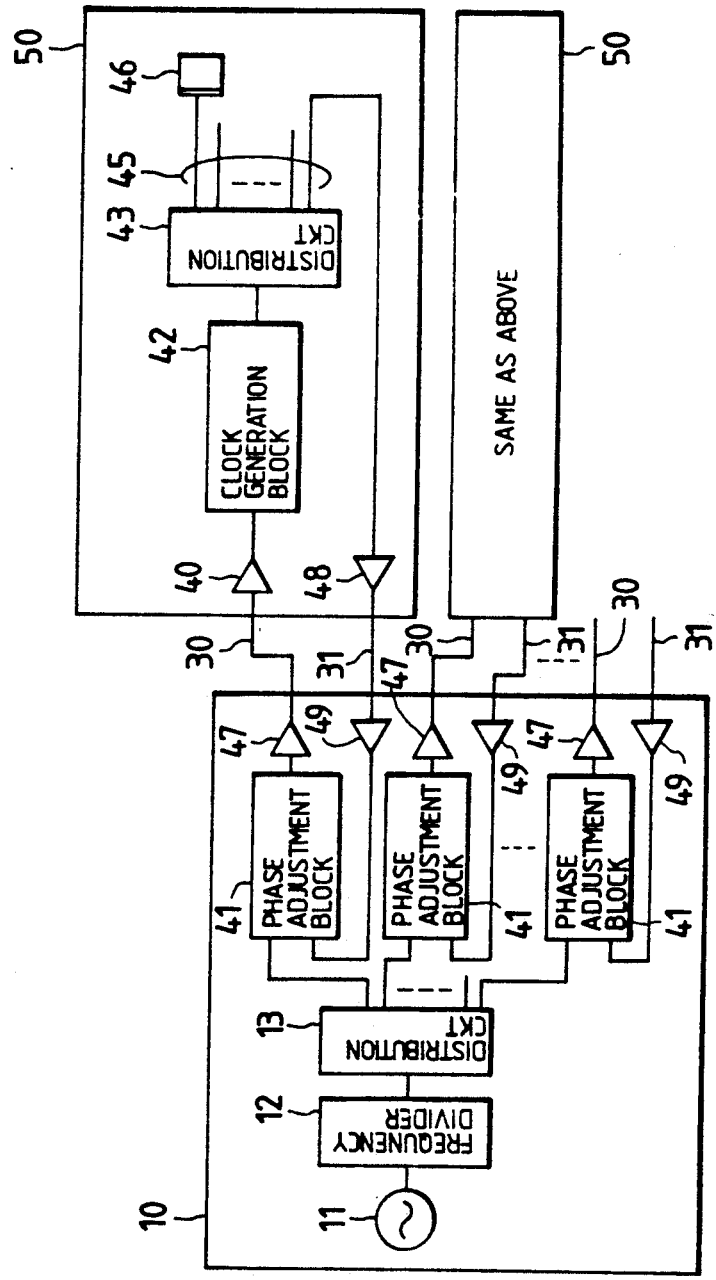
FIG. 18 is an overall structural view showing another embodiment of the present invention.

FIG. 18 shows an overall structure of another embodiment relating to the overall construction of the present invention. Whereas FIG. 1(a) adjusts the phases of the input signals of the processing units 50 by use of the delay 14, this embodiment eliminates the delay and makes fully automatic adjustment. The clock generation unit includes an oscillator 11, a frequency divider 12, a distribution circuit 13, a phase adjustment block 41 for each processing unit 50, an output buffer 47 and an input buffer 49. At least the distribution circuit 13, the phase adjustment blocks 41, the output buffers 47 and the input buffers 49 are formed on the same LSI. The wiring length between the distribution circuit 13 to the phase adjustment block 41 is equal to that between the input buffer 49 to the phase adjustment block 41. The output of the clock generation block 10 is supplied as the one-phase reference clock to each processing unit 50 through the signal path 30. Each processing unit 50 generates the multi-phase clocks used therein from the signal supplied from the clock generation block 42 through the input buffer 40 and supplies them to the flip-flop 46 and the output buffer 48 as the destinations through the distribution circuit 43 and the wiring 45. Each wiring 45 has an equal length so as to minimize the skew at each destination 46. The output from the output buffer 48 is inputted to the phase comparator 53 of the phase adjustment block 41 through the signal path 31 having the equal wiring length and through the input buffer 49 and its phase is aligned with that of the output of the distribution circuit 13 as the reference clock. Since the propagation time is substantially equal from each input buffer 49 to the input of the phase adjustment block 41, the phases of the outputs of the output buffers 48 of the processing units 50 can be aligned. The clock skew between the processing units 50 can be regarded as the variance at the destination 46 or in other words the phase variance of the input of the output circuit 48. In this embodiment, since the phase adjustment is made while including the variance of the delay time of the output buffers 48, this results in the clock skew.

Whereas the embodiment shown in FIG. 1 aligns the phases at the inputs of the flip-flops 46 of the processing units 50, the variance of the delay time of the output buffers 48 between LSIs remains as the skew between the processing units. However, the number of adjustment steps can be eliminated because the phase adjustment by replacing the delays 14 as required in the embodiment shown in FIG. 1 is not necessary.

If each of the embodiments of the present invention described above is used for the clock distribution system of a computer, the number of lines of clock signals in the signal paths can be reduced, the clock skew relating to the clock signals distributed to the destinations of LSIs can be reduced and a computer resulting having stable and high performance.

According to the present invention, the number of clock signal lines to be distributed to each LSI can be reduced and multi-phase clock signals having small skew inside LSI can be generated. Furthermore, performance of the computer can be improved as described above.

What is claimed is:

1. A clock distribution system comprising:
   a clock signal generation block for generating a one-phase reference clock;
   a first control means for comparing a phase of said reference clock with a phase of a feedback signal and controlling the phase of said reference clock so that the phases are coincident with each other and providing a phase adjusted reference clock;
   a delay circuit having a plurality of variable delay circuits which are connected in series and to which said phase adjusted reference clock is inputted;
   means for generating multi-phase clock signals in response to output signals of said plurality of variable delay circuits and said phase-adjusted reference clock; and
   a second control means for comparing a delay time of said plurality of variable delay circuits with a period of said phase-adjusted reference clock and controlling the delay time of said plurality of variable delay circuits so as to establish a predetermined relation with the period of said phase-adjusted reference clock, wherein one of said multi-phase clock signals is applied as said feedback signal to said first control means.

2. A clock distribution system according to claim 1, wherein said first control means comprises variable delay means for adjusting the phase of said reference clock, phase comparison means for comparing the phase of said reference clock with that of said feedback signal and delay control means for controlling said variable delay means in response to the comparison result by said phase comparison means.

3. A clock distribution system according to claim 1, wherein said second control means includes a variable frequency oscillator for generating a signal having a frequency which is a multiple of the frequency of said phase-adjusted reference clock, and a control circuit for generating a control signal in response to said signal of the variable frequency oscillator and said phase-adjusted reference clock, said control signal controlling said variable frequency oscillator so that the frequency of said variable frequency oscillator becomes a multiple of the frequency of said phase-adjusted reference clock, and the delay time of said plurality of variable delay circuits is controlled by said control signal.

4. A clock distribution system according to claim 1, wherein said second control loop includes a phase comparator for comparing the phase of said phase-adjusted reference clock with the phase of an output signal of said delay circuit group, and a control circuit for controlling the delay time of said plurality of variable delay circuits so that the phase of the output signal of said delay circuit group is coincident with the phase of said phase-adjusted reference clock in response the comparison result by said phase comparator.

5. A clock distribution system according to claim 1, wherein said first control means stops the adjustment of the phase of said reference clock while said second control means controls the delay time of said plurality of variable delay circuits, the control by said second control means is stopped after completion of the control by said second control means, then the phase adjustment by said first control means is started and after completion of the phase adjustment by said first control means, the phase adjustment by said first control means is stopped.

6. A clock distribution system according to claim 1, wherein said first control means, said delay circuit group, said means for generating multi-phase clock signals and said second control means are disposed in each of a plurality of processing units and said reference clock signals are distributed to said processing units through signal paths.

7. A clock distribution system according to claim 1, wherein said first control means and said clock signal generation block are disposed in a first processing unit and said delay circuit group, said means for generating and said second control means are disposed in a second processor unit, said phase-adjusted reference clock is supplied from said first processing unit to said second processing unit through a first signal path, and said feedback signal is supplied from said second processing unit to said first processing unit through a second signal path.

8. A clock distribution system according to claim 7 further comprising a plurality each of said first control means, said delay circuit group, said means for generating and said second control means are disposed in the first processing unit and said plurality each of said delay circuit group, means for generating and said second control means are disposed in each of a plurality of second processing units.

9. A clock distribution system in accordance with claim 1 wherein said clock distribution system is disposed in a computer.

10. In a clock distribution system for a computer which includes a clock signal generation block, signal paths and a plurality of processing units and wherein a predetermined first clock signal is distributed to said plurality of processing units from the output of said clock generation block through said signal paths with each processing unit including:
   means for aligning a phase of said first clock signal with a phase of a second clock signal and providing a phase-adjusted first clock signal;
   a delay circuit group of a plurality of variable delay circuits which each have an equal delay time, are connected in series and receive said phase-adjusted first clock signal;
   means for generating multi-phase second clock signals in response to output signals from said plurality of variable delay circuits and said phase-adjusted first clock signal; and
   means for controlling the delay time of said plurality of said variable delay circuits to be less than the period of said first clock signal.

11. A clock distribution system according to claim 10, wherein said means for aligning the phases of said first and second clock signals includes:
   variable delay means for adjusting the phase of said first clock signal;
   phase comparison means for comparing the phase of said first clock signal with the phase of said second clock signal generated by use of the output of said variable delay means; and
   delay control means for controlling said variable delay means in response to the comparison result by said phase comparison means.

12. A clock distribution system according to claim 11, wherein said phase comparison means includes a set-reset flip-flop circuit to which said first and second clock signals are inputted, a synchronization circuit for synchronizing an output of said flip-flop circuit, a first counter circuit for providing a predetermined output when output of said synchronization circuit is continuously an one level for a predetermined time period and a second counter circuit for generating a predetermined output when a predetermined output of said first counter circuit is not generated within said predetermined time period.

13. A clock distribution system according to claim 10, wherein said control means for controlling the delay time of said plurality of variable delay circuits includes a delay time detection circuit for measuring the delay time of said variable delay circuits and a delay control circuit for controlling the delay time of said variable delay circuits in response to the result of measurement from said delay time detection circuit.

14. A clock distribution system according to claim 13, wherein said variable time detection circuit includes a variable frequency oscillator formed by connecting an input and output terminals of the variable frequency oscillator to one of said plurality of variable delay circuits and a phase comparator for comparing a phase of a frequency division signal of an output signal of said variable frequency oscillator with the phase of a frequency division signal of said first clock signal.

15. A clock distribution system according to claim 14, wherein the delay time of said variable delay circuit used for said variable frequency oscillator is controlled by an output of said delay control circuit, wherein said output of said delay control circuit is a digital signal.

16. A clock distribution system according to claim 11, wherein the control by said variable delay means is stopped during the adjustment of the delay time in the control of the delay time of said variable delay circuit, after completion of this adjustment, the control of said variable delay circuit is stopped and at the same time, the control of said variable delay means is started and after this adjustment is complete, the control of said variable delay means is stopped.

17. A clock distribution system according to claim 10, wherein said means for controlling includes a phase comparator for comparing a phase of the output signal from a plurality of variable delay circuits to which said phase-adjusted first clock signals is inputted, which have an equal delay time and which are connected in series, with said phase-adjusted first clock signal, and a control circuit for controlling the delay time of said variable delay circuits in response to the comparison result by said phase comparator.

18. In a clock distribution system for a computer which includes a clock signal generation block, signal paths and a processing unit and in which a phase-adjusted clock signal is supplied to said processing unit from an output of said clock signal generation block through said signal paths, a clock distribution system comprising:
   means for aligning a phase of a one-phase first clock signal with a phase of a second clock signal, disposed in said clock signal generation block, so that a phase aligned one-phase first clock signal is supplied as said phase-adjusted first clock signal to said first processing unit as a destination;
   a delay circuit group of a plurality of series connected variable delay circuits receiving said first clock signal, said delay circuit group being disposed in said processing unit;
   means for generating multi-phase second clock signals in response to output signals of each of said plurality of variable delay circuits and said phase-adjusted first clock signal, said means for generating being disposed in said processing unit and one of said multi-phase second clock signals being provided to said means for aligning; and
   means for controlling a delay time of said plurality of delay circuits so that the delay time is less than a period of said first clock signal, said means for controlling being disposed in said processing unit.

19. A clock distribution system according to claim 18, wherein said clock generation block comprises an oscillator, a frequency divider for dividing the frequency of the output of said oscillator and generating said first clock, a distribution circuit for distributing the output of said frequency divider to said phase alignment means and a plurality of said phase alignment means, at least said distribution circuit and said plurality of phase alignment means being disposed inside the same processing unit.

20. A clock distribution system in accordance with claim 10 wherein said clock distribution system is disposed in a computer.

21. A clock distribution system in accordance with claim 18 wherein said clock distribution system is disposed in a computer.

* * * * *